(12) United States Patent
Miller, Jr. et al.

(10) Patent No.: US 6,300,668 B2
(45) Date of Patent: *Oct. 9, 2001

(54) HIGH RESISTANCE INTEGRATED CIRCUIT RESISTOR

(75) Inventors: James E. Miller, Jr.; Manny K. F. Ma, both of Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/375,852

(22) Filed: Aug. 17, 1999

Related U.S. Application Data

(63) Continuation of application No. 08/963,103, filed on Nov. 3, 1997, now Pat. No. 5,990,538, which is a continuation of application No. 08/753,399, filed on Nov. 26, 1996, now abandoned, which is a division of application No. 08/595,232, filed on Feb. 1, 1996, now Pat. No. 5,679,593.

(51) Int. Cl.$^7$ ................................................. H01L 29/8605
(52) U.S. Cl. .................... 257/536; 257/537; 257/516; 257/379
(58) Field of Search ..................... 438/253, 329, 438/328, 332; 257/351, 358, 329, 379, 536, 537, 516

(56) References Cited

U.S. PATENT DOCUMENTS

| | | | |
|---|---|---|---|
| 3,629,667 | * 12/1971 | Lubart | 317/234 R |
| 3,735,481 | 5/1973 | Makimoto | 29/578 |
| 3,795,828 | 3/1974 | Cavaliere et al. | 307/303 |
| 3,879,236 | 4/1975 | Langdon | 148/175 |
| 4,418,469 | 12/1983 | Fujita | 29/577 |
| 5,001,528 | 3/1991 | Bahraman | 357/23.7 |
| 5,023,195 | 6/1991 | Sekikawa et al. | 437/153 |
| 5,066,602 | 11/1991 | Takemoto et al. | 437/918 |
| 5,134,088 | 7/1992 | Zetterlund | 437/60 |
| 5,439,841 | 8/1995 | Alter | 437/918 |
| 5,489,547 | 2/1996 | Erdeljac et al. | 437/60 |
| 5,489,796 | 2/1996 | Harward | 257/379 |
| 5,990,538 | * 11/1999 | Miller, Jr. et al. | 257/536 |

* cited by examiner

Primary Examiner—Minh Loan Tran
(74) Attorney, Agent, or Firm—Schwegman, Lundberg, Woessner & Kluth, P.A.

(57) ABSTRACT

The present invention teaches fabrication of a high-resistance integrated circuit diffusion resistor that uses standard CMOS process steps. By appropriate masking during ion-implantation of source/drain diffusion regions, diffusion resistors created during NMOS source/drain implant may be counterdoped during PMOS source/drain implants and vice-versa. By appropriate choice of relative concentrations of a resistor dopant and counterdopant, and choice of diffusion depths, junction diodes can be formed which create a pinched resistor by constricting the current flow. The relative dopant concentrations can also be chosen to create regions of light effective doping within the diffusion resistor rather than creating junction diodes.

39 Claims, 3 Drawing Sheets

US 6,300,668 B2

HIGH RESISTANCE INTEGRATED CIRCUIT RESISTOR

This application is a Continuation of U.S. Ser. No. 08/963,103, filed Nov. 3, 1997, now U.S. Pat. No. 5,990,538, which is a File Wrapper Continuation of U.S. Ser. No. 08/753,399, filed Nov. 26, 1996, now abandoned, which is Divisional of U.S. Ser. No. 08/595,232, filed Feb. 1, 1996, now U.S. Pat. No. 5,679,593.

THE FIELD OF THE INVENTION

The present invention relates to semiconductor integrated circuits and, more particularly, to fabrication of resistors during integrated circuit processing.

BACKGROUND OF THE INVENTION

Integrated circuit designers use a variety of components to implement desired circuit functionality. These components may include bipolar and field-effect transistors, junction diodes, capacitors, and resistors.

Resistors are used for a wide variety of circuit applications in which resistance values are required to be quite large. For example, a resistor might be used to limit the current between its terminals for a given applied voltage. Such an applied voltage might be due to electrostatic discharge (ESD) which can damage integrated circuits. By choosing a large resistance value, the current produced by an ESD pulse of given voltage can be reduced, affording more protection to the integrated circuit. Resistors can also be used in reference circuits such as a bandgap voltage reference or as feedback elements in conjunction with operational amplifier circuits. Another application of the integrated circuit resistor is its use with an integrated circuit capacitor to form a characteristic time constant for signal frequency filtering applications. In order to pass very low frequencies, the desired product of the resistance and capacitance might be appreciable, demanding large resistance values. In low-power applications, large resistors are useful for limiting currents thereby reducing power consumption.

Integrated circuit resistors can be fabricated by the deposition of thin-film materials including nichrome or tantalum, but such implementations add process steps to a standard complementary metal-oxide-semiconductor (CMOS) process. Integrated circuit resistors can also be fabricated using standard CMOS processing steps. For example, resistors can be created from the polysilicon used to form the gate regions of metal-oxide-semiconductor field-effect transistors (MOSFETs), or from the diffused well regions in which MOSFETs are later created, or from the ion-implantation step used to create source and drain diffusion regions of MOSFETs.

Since implementing a resistor uses area on an integrated circuit die, it is desirable to increase the resistance obtained using a given circuit area without adding complexity to a standard CMOS process.

SUMMARY OF THE INVENTION

The primary object of this invention is to increase the resistance obtained from a diffusion resistor without increasing the integrated circuit area dedicated to implement the resistance and without increasing the complexity of the integrated circuit process.

In particular, the present invention describes a method for utilizing the ion-implanted dopants which form the source and drain regions of n-channel and p-channel transistors to form a diffusion resistor composed of a first dopant and of banded regions of a counterdopant. In this way, the resistance of a diffusion resistor can be increased without increasing the area on the integrated circuit die occupied by the resistor or increasing the process complexity of a standard CMOS process.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
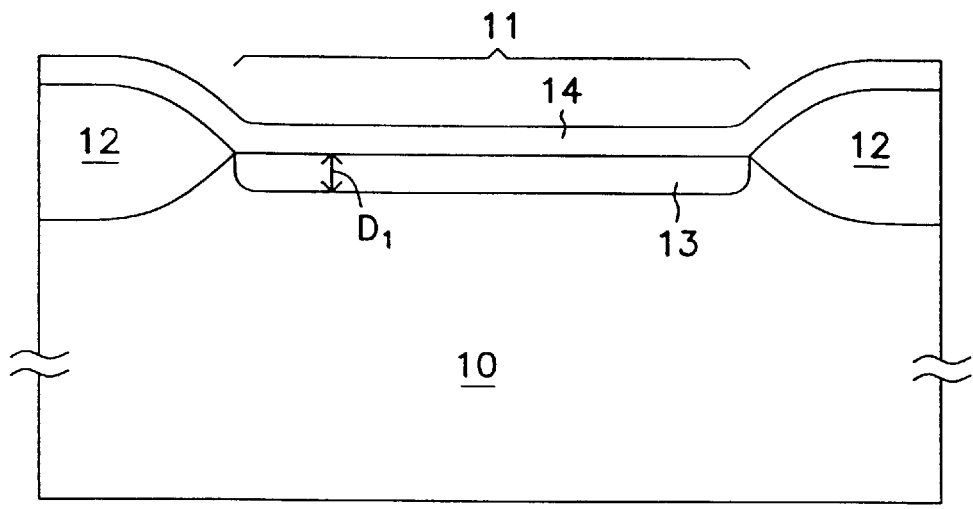
FIG. 1 is a schematic cross-sectional view of a supporting substrate upon which a first dopant region has been created in an active area region, and a masking layer has been formed.

In FIG. 1, a cross-sectional view of a semiconductor substrate 10 is schematically shown. In the preferred embodiment, this substrate 10 is a p-type silicon wafer, however other types of wafers may also be used, including an n-type silicon wafer, a silicon-on-insulator (SOI) wafer, or a wafer with an epitaxially grown surface layer. Using conventional CMOS process steps, active areas 11 are defined in which NMOS and PMOS field-effect transistors will be fabricated. A thick insulating Field-OXide (FOX) 12 is grown outside of these active areas 11 to isolate the transistors from each other. Active areas 11 are also defined where diffusion resistors will be fabricated. The shape of such active areas 11 will correspond to the diffusion resistor's shape on the surface of the semiconductor substrate 10.

Referring still to FIG. 1, a first dopant region 13 is formed within an active area 11. In the preferred embodiment, first dopant region 13 is formed by the same ion-implantation step used to simultaneously create n-type heavily doped (n+) NMOS transistor source/drain regions and n+ohmic contacts (guardbars) to contact n-type diffused well (n-well) regions created in substrate 10 as part of a conventional n-well CMOS process flow.

Referring still to FIG. 1, a masking layer 14 has been deposited everywhere on the wafer of FIG. 1. This photoresist (PR) masking layer 14 is used to mask the entire wafer except those regions defining MOS source/drains, those regions defining ohmic contacts (Quardbars) with doping type opposite to that of first dopant region 13, and those regions where a counterdopant is to be introduced into the first dopant region 13.

Figure 2A:
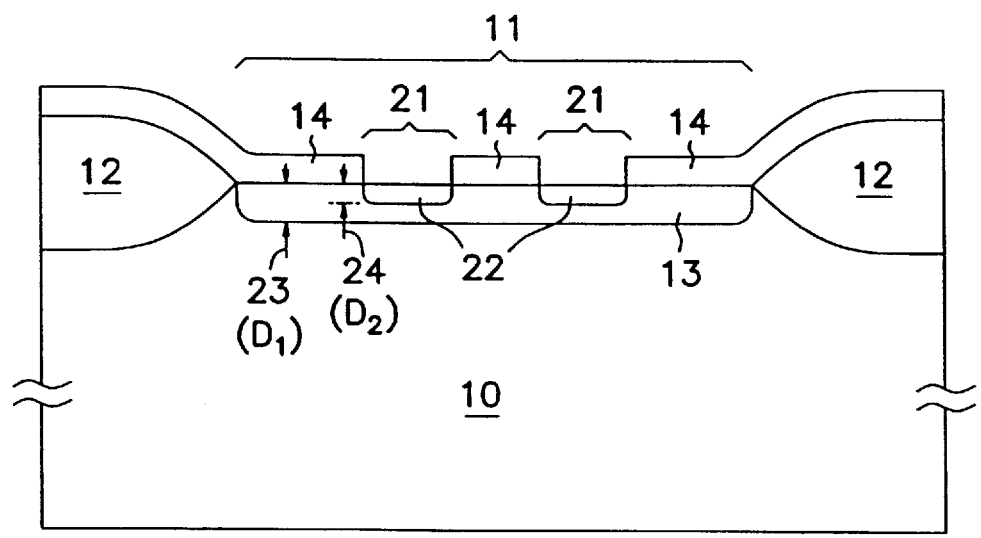
FIG. 2A shows the view of FIG. 1 after the masking layer is patterned and etched, and after counterdopant regions have been formed.

In the cross-sectional view of FIG. 2A, the masking layer 14 has been patterned to form at least one opening 21 at least partially over the first dopant region 13. Any opening 21 over first dopant region 13 has been used to define a counterdopant region 22 which at least partially intersects the first dopant region 13. This differs from a conventional CMOS process flow in which openings 21 in masking layer 14 are created only to define MOS source/drains and ohmic contacts (guardbars) with doping type opposite to that of first dopant region 13. In a conventional CMOS process flow openings 21 do not intersect the first dopant region 13.

In FIG. 2A, the approximate depth of the first dopant region 13 is indicated by first dopant depth 23, and the approximate depth of the counterdopant region 22 is indicated by counterdopant depth 24. These depths are approximate because the diffused junctions themselves are not abruptly defined, but graded. Also, these depths include a depletion region formed at the junction interface which depends on the voltage applied to the integrated circuit resistor.

In the preferred embodiment, any counterdopant region 22 is created by the same ion-implantation step used to create PMOS source/drain diffusions and p-type heavily doped (p+) ohmic contact regions (guardbars) to contact substrate 10.

Referring still to FIG. 2A, it should be well understood to one skilled in the art that n-type starting material could also be used as the substrate 10. In this first alternative embodiment, the first dopant region 13 may be created with the same p+ ion-implantation step used to create PMOS source/drain diffusions and p+ guardbars to contact p-type diffused well (p-well) regions created in substrate 10 as part of a conventional p-well CMOS process flow. In this first alternative embodiment, the masking layer 14 defining openings 21 may be the same masking layer used to define NMOS source/drain diffusions and n+ guardbars to contact substrate 10. In this first alternative embodiment, any counterdopant region 22 may be created by the same ion-implantation step used to create NMOS source/drain diffusions and n+ guardbars to contact substrate 10.

Referring still to FIG. 2A, it should be well understood by one skilled in the art that first dopant region 13 could be contained within a p-well created by conventional p-well CMOS processing using n-type wafer as the starting material for substrate 10. In this second alternative embodiment, the first dopant region 13 may be created with the same ion-implantation step used to create NMOS source/drain diffusions and n+ guardbars to contact the n-type substrate 10. In this second alternative embodiment, the masking layer 14 defining openings 21 may be the same masking layer used to define PMOS source/drain diffusions and p+ guardbars to contact a p-well region created in substrate 10 as part of a conventional p-well process flow. In this second alternative embodiment, any counterdopant region 22 may be created by the same ion-implantation step used to create PMOS source/drain diffusions and p+ guardbars to contact a p-well region created in substrate 10 as part of a conventional p-well process flow.

Referring still to FIG. 2A, it should be well understood by one skilled in the art that first dopant region 13 could be contained within an n-well created by conventional n-well CMOS processing using a p-type wafer as starting material for substrate 10. In this third alternative embodiment, the first dopant region 13 may be created with the same ion-implantation step used to create PMOS source/drain diffusions and p+ guardbars to contact the p-type substrate 10. In this third alternative embodiment, the masking layer 14 defining openings 21 may be the same masking layer used to define NMOS source/drain diffusions and n+guardbars to contact an n-well region created in substrate 10 as part of a conventional n-well process flow. In this third alternative embodiment, any counterdopant region 22 may be created by the same ion-implantation step used to create NMOS source/drain diffusions and n+ guardbars to contact an n-well region created in substrate 10 as part of a conventional n-well process flow.

Referring still to FIG. 2A, the relative doping concentrations of the first dopant region 13 and counterdopant region 22 can be described. In the preferred embodiment, the counterdopant region 22 has a higher doping concentration than the first dopant region 13, forming junction diodes between the first dopant region 13 and the counterdopant region 22. The counterdopant region 22 terminal of each junction diodes is left unconnected. In the preferred embodiment, current flow through the first dopant region 13 is pinched between counterdopant depth 24 and the substrate 10.

Figure 2B:
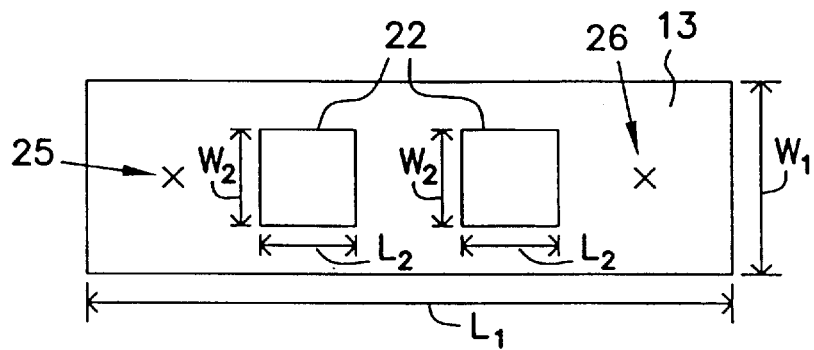
FIG. 2B shows a schematic top view of the preferred embodiment of the resistor.

FIG. 2B shows a schematic top view of the preferred embodiment looking at the surface of the wafer. The surface area of the counterdopant region 22 is enclosed by the surface area of the first dopant region 13. It should be understood by one skilled in the art that many resistor shapes are defined on the surface of the wafer, including serpentine patterns, etc., and the top view of FIG. 2B is schematic only. If contacts to the first dopant region 13 are formed at points 25 and 26, then the current through the first dopant region 13 between points 25 and 26 flows around the counterdopant regions 22 in those portions of the first dopant region 13 which are less deep than the counterdopant depth 24. This pinching of the first dopant region 13 by the counterdopant regions 22 is therefore transverse to the direction of current flow between points 25 and 26 and parallel to the plane of the wafer's surface.

Figure 2C:
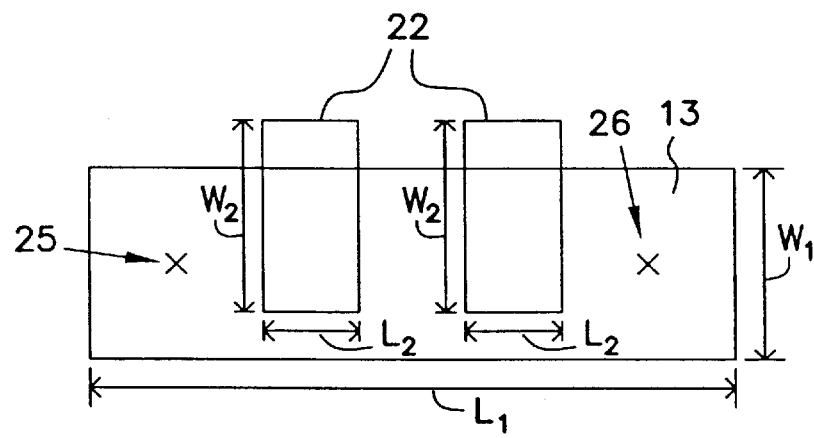
FIG. 2C shows a schematic top view of an alternative embodiment of the resistor.

FIG. 2C is a schematic top view of an alternate embodiment which shows the surface of the counterdopant region 22 extending outside the surface of the first dopant region 13. This alternative embodiment results in further pinching of the first dopant region 13 by the counterdopant region 22 with this further pinching transverse to the direction of current flow between points 25 and 26 and parallel to the plane formed by the surface of the wafer.

Figure 2D:
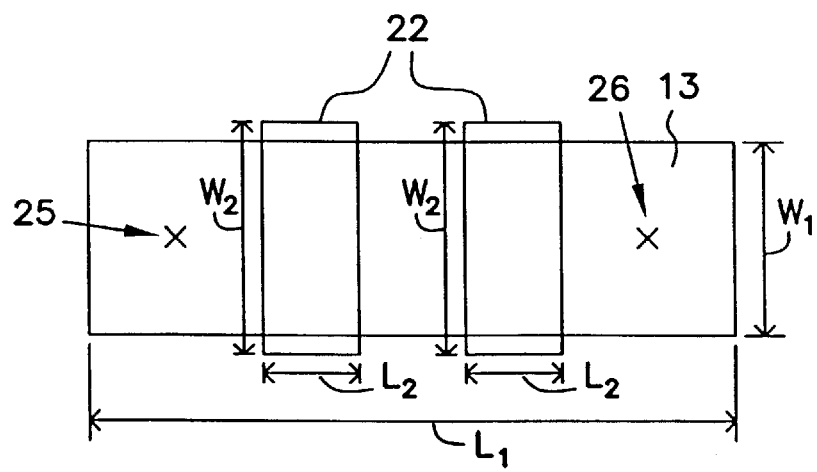
FIG. 2D shows a schematic top view of an alternative embodiment of the resistor.

FIG. 2D is a schematic top view of an alternative embodiment which shows the surface of the counterdopant region 22 extending outside the surface of the first dopant region 13 such that current flow along the surface of the first dopant region 13 or at depths less than counterdopant depth 24 is completely blocked by at least one counterdopant region 22. In this alternative embodiment, the pinching of the first dopant region is as shown in the cross-sectional view of FIG. 2A, between the counterdopant depth 24 and the substrate 10.

Figure 2E:
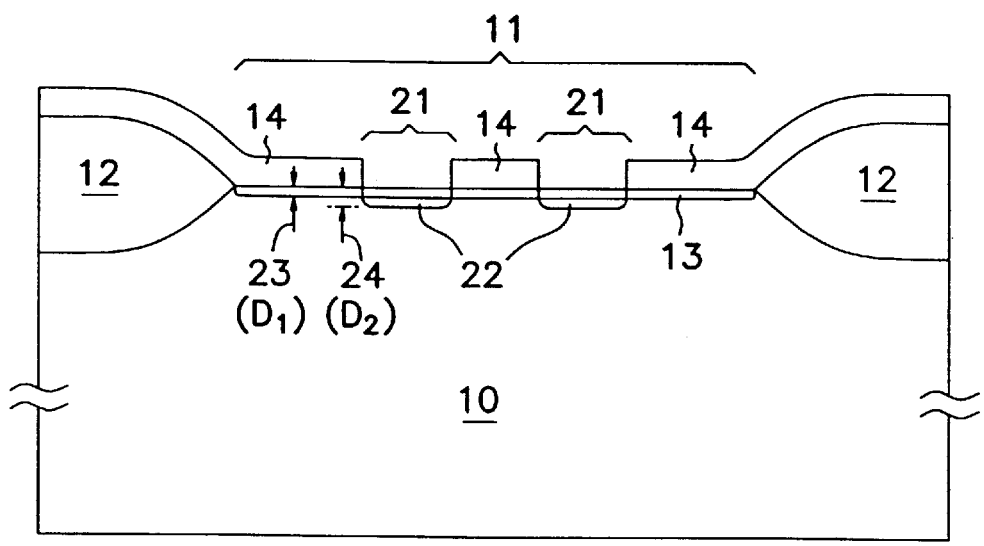
FIG. 2E shows a schematic cross-sectional view of an embodiment used as an alternative to FIG. 2A.

In the schematic cross-sectional view of FIG. 2E, the counterdopant depth 24 exceeds the first dopant depth 23. This alternative embodiment can be used in conjunction with either top view shown in FIG. 2B or FIG. 2C. However, if the dopant concentration of the counterdopant region 22 exceeds the dopant concentration of the first dopant region 13 as stated above, FIG. 2E cannot be used in conjunction with FIG. 2D since the junction diode formed by the boundary between counterdopant region 22 and first dopant region 13 will completely block current conduction through the first dopant region 13.

Alternatively, the counterdopant region 22 can have a lower doping concentration than the first dopant region 13. In this case, junction diodes are not formed. Since the doping concentration of the counterdopant region 22 is lower than the doping concentration of the first dopant region 13, the effective net doping type of the counterdopant regions 22 is the same type as the first dopant region 13. Such counterdopant regions 22 do not create junction diodes, but instead present regions of lower effective doping concentration than the doping concentration of the first dopant region 13. Since resistivity increases as doping concentration is lowered, the counterdopant regions 22 present regions of higher resistivity than presented by the first dopant region 13 alone. Since no diodes are formed, the schematic cross-sectional view of FIG. 2E can be used in conjunction with the top view of FIG. 2D when the first dopant concentration exceeds the counterdopant concentration.

Figure 3:
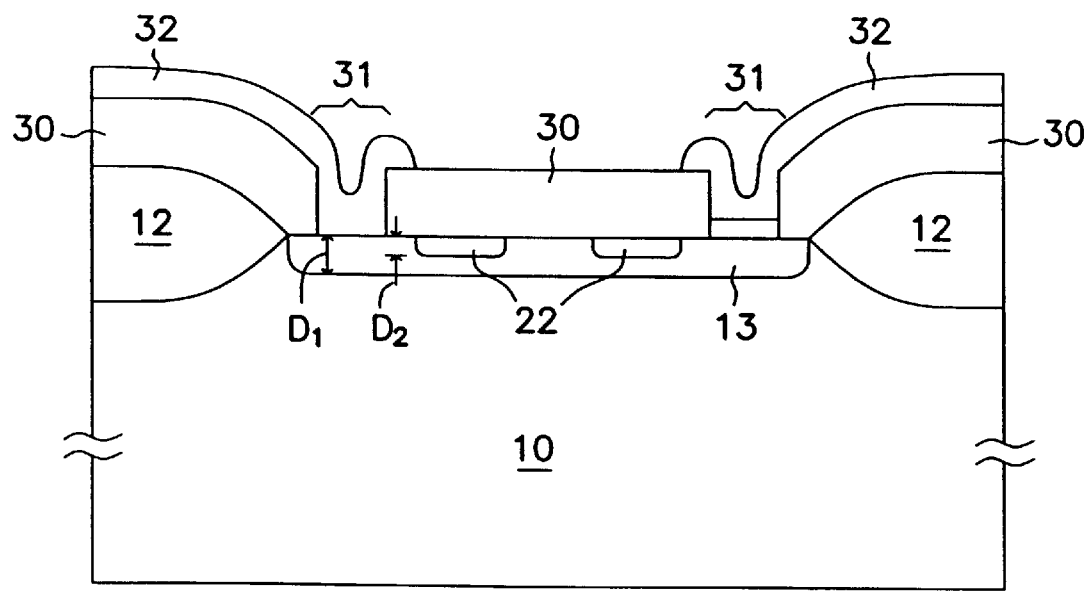
FIG. 3 shows the view of FIG. 2A after an insulating layer and contacts have been formed.

In the schematic cross-sectional view of FIG. 3, the masking layer 14 of FIG. 2 has been removed by conventional photoresist stripping techniques, and an insulating layer 30 has been deposited as part of a conventional CMOS process. Contact holes 31 have been created in insulating layer 30 as part of a conventional CMOS process and separate metal contacts 32 to first dopant region 13 have been created by conventional CMOS processing techniques.

What is claimed is:

1. A integrated circuit resistor fabricated in a substrate having a surface, the resistor comprising:
   a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define an area substantially parallel to the surface of the semiconductor substrate, and $D_1$ extends substantially orthogonally to each of $L_1$ and $W_1$ into the substrate;
   at least two electrical contacts to the first conductivity type region for allowing current flow between the contacts through the first conductivity type region; and
   at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define an area substantially parallel the surface of the semiconductor substrate, and $D_2$ extends substantially orthogonally to each of $L_2$ and $W_2$ into the substrate and is approximately equal to the depth $D_1$;
   $L_1$ and $L_2$ are substantially parallel to each other; and
   the area defined by $L_2$ and $W_2$ at least partially intersects the area defined by $L_1$ and $W_1$.

2. The resistor of claim 1, wherein the width $W_2$ spans the width $W_1$.

3. An integrated circuit resistor fabricated in a substrate having a surface, the resistor comprising:
   a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define a first cross sectional area substantially parallel to the surface of the semiconductor substrate, and $D_1$ extends substantially orthogonally to each of $L_1$ and $W_1$ into the substrate;
   at least two electrical contacts to the first conductivity type region for allowing current flow between the contacts through the first conductivity type region; and
   at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define a second cross sectional area substantially parallel the surface of the semiconductor substrate, and $D_2$ extends substantially orthogonally to each of $L_2$ and $W_2$ into the substrate;
   $L_1$ and $L_2$ are substantially parallel to each other; and
   the first cross sectional area at least partially intersects the second cross sectional area and the first cross sectional area exceeds the second cross sectional area.

4. The resistor of claim 3, wherein the depth $D_1$ exceeds the depth $D_2$.

5. The resistor of claim 3, wherein the depth $D_2$ exceeds the depth $D_1$.

6. The resistor of claim 3, wherein the depth $D_2$ is approximately equal to the depth $D_1$.

7. The resistor of claim 3, wherein the width $W_2$ spans the width $W_1$.

8. An integrated circuit resistor fabricated in a substrate having a surface, the resistor comprising:
   a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define a first cross sectional area substantially parallel to the surface of the semiconductor substrate, and $D_1$ extends substantially orthogonally to each of $L_1$ and $W_1$ into the substrate;
   at least two electrical contacts to the first conductivity type region for allowing current flow between the contacts through the first conductivity type region; and
   at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define a second cross sectional area substantially parallel the surface of the semiconductor substrate, and $D_2$ extends substantially orthogonally to each of $L_2$ and $W_2$ into the substrate;
   $L_1$ and $L_2$ are substantially parallel to each other; and
   the first cross sectional area least partially intersects the second cross sectional area and the second cross-sectional area exceeds the first cross-sectional area.

9. The resistor of claim 8, wherein the depth $D_1$ exceeds the depth $D_2$.

10. The resistor of claim 8, wherein the depth $D_2$ exceeds the depth $D_1$.

11. The resistor of claim 8, wherein the depth $D_2$ is approximately equal to the depth $D_1$.

12. The resistor of claim 8, wherein the width $W_2$ spans the width $W_1$.

13. An integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define a first cross sectional area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define a second cross sectional area substantially parallel the surface of the semiconductor substrate, and $D_2$ extends substantially orthogonally to each of $L_2$ and $W_2$ into the substrate;

$L_1$ and $L_2$ are substantially parallel to each other; and the first cross sectional area at least partially intersects the second cross sectional area and the first and second cross-sectional areas are approximately equal.

14. An integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_2$ define an area substantially parallel to the surface of the semiconductor substrate, and $D_2$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define an area substantially parallel the surface of the semiconductor substrate, and $D_2$ extends substantially orthogonally to each of $L_2$ and $W_2$ into the substrate and wherein the depth $D_1$ is about equal to or exceeds the depth $D_2$;

$L_1$ and $L_2$ are substantially parallel to each other; and the area defined by $L_2$ and $W_2$ at least partially intersects the area defined by $L_1$ and $W_1$.

15. The resistor of claim 14, wherein the depth $D_1$ exceeds the depth $D_2$.

16. The resistor of claim 14, wherein the depth $D_2$ exceeds the depth $D_1$.

17. The resistor of claim 14, wherein the depth $D_2$ is approximately equal to the depth $D_1$.

18. The resistor of claim 14, wherein the width $W_2$ spans the width $W_1$.

19. A integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define an area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define an area substantially parallel the surface of the semiconductor substrate, and $D_2$ extends substantially orthogonally to each of $L_2$ and $W_2$ into the substrate and the depth $D_2$ is about equal to or exceeds the depth $D_1$;

$L_1$ and $L_2$ are substantially parallel to each other; and the area defined by $L_2$ and $W_2$ at least partially intersects the area defined by $L_1$ and $W_1$.

20. A integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$, and $W_1$ define a first cross-sectional area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define a second cross-sectional area substantially parallel the surface of the semiconductor substrate, and $D_2$ extends substantially orthogonally to each of $L_2$ and $W_2$ into the substrate;

$L_1$ and $L_2$ are substantially parallel to each other; and the first cross-sectional area at least partially intersects the second cross-sectional area and the first cross sectional area is about equal to or exceeds the second cross-sectional area.

21. The resistor of claim 20, wherein the depth $D_1$ exceeds the depth $D_2$.

22. The resistor of claim 20, wherein the depth $D_2$ exceeds the depth $D_1$.

23. The resistor of claim 20, wherein the depth $D_2$ is approximately equal to the depth $D_1$.

24. The resistor of claim 20, wherein the width $W_2$ spans the width $W_1$.

25. An integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define a first cross-sectional area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define a second cross sectional area substantially parallel the surface of the semiconductor substrate, and $D_2$ extends substantially orthogonally to each of $L_2$ and $W_2$ into the substrate;

$L_1$ and $L_2$ are substantially parallel to each other; and the first cross-sectional area at least partially intersects the second cross-sectional and the second cross-sectional area is about equal to or exceeds the first cross-sectional area.

26. The resistor of claim 25, wherein the depth $D_2$ exceeds the depth $D_2$.

27. The resistor of claim 25, wherein the depth $D_2$ exceeds the depth $D_1$.

28. The resistor of claim 25, wherein the depth $D_2$ is approximately equal to the depth $D_1$.

29. The resistor of claim 25, wherein the width $W_2$ spans the width $W_1$.

30. A integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define an area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define an area substantially parallel the surface of the semiconductor substrate, and $D_2$ extends substantially orthogonally to each of $L_2$ and $W_2$ into the substrate;

$L_1$ and $L_2$ are substantially parallel to each other; and the area defined by $L_2$ and $W_2$ at least partially intersects the area defined by $L_1$ and $W_1$.

31. The resistor of claim 30, wherein the depth $D_1$ exceeds the depth $D_2$.

32. The resistor of claim 30, wherein the depth $D_2$ exceeds the depth $D_1$.

33. The resistor of claim 30, wherein the depth $D_2$ is approximately equal to the depth $D_1$.

34. The resistor of claim 30, wherein the width $W_2$ spans the width $W_1$.

35. A integrated circuit resistor fabricated in a substrate having a surface, the resistor comprising:

a contiguous first conductivity type region formed in the substrate, wherein the first conductivity type region has a dopant depth that is approximately equal to a dopant depth of a first conductivity type transistor source/drain region formed elsewhere in the substrate and also has a length $L_1$, a width $W_1$, and a depth $D_1$, and in which $L_1$ and $W_1$ define an area substantially parallel to the surface of the semiconductor substrate, and $D_1$ extends substantially orthogonally to each of $L_1$ and $W_1$ into the substrate;

at least two electrical contacts to the first conductivity type region for allowing current flow between the contacts through the first conductivity type region; and at least one second conductivity type region formed in the substrate such that the second conductivity type region at least partially intersects the first conductivity type region for increasing resistance to the current flow between the contacts, wherein the second conductivity type region has a dopant depth that is approximately equal to a dopant depth of a second conductivity type transistor source/drain region formed elsewhere in the substrate and also has a length $L_2$, a width $W_2$, and a depth $D_2$, and in which $L_2$ and $W_2$ define an area substantially parallel the surface of the semiconductor substrate, and $D_2$ extends substantially orthogonally to each of $L_2$ and $W_2$ into the substrate;

$L_1$ and $L_2$ are substantially parallel to each other; and the area defined by $L_2$ and $W_2$ at least partially intersects the area defined by $L_1$ and $W_1$.

36. The resistor of claim 35, wherein the depth $D_1$ exceeds the depth $D_2$.

37. The resistor of claim 35, wherein the depth $D_2$ exceeds the depth $D_1$.

38. The resistor of claim 35, wherein the depth $D_2$ is approximately equal to the depth $D_1$.

39. The resistor of claim 35, wherein the width $W_2$ spans the width $W_1$.

* * * * *